United States Patent
Gherman

(10) Patent No.: US 12,154,647 B2
(45) Date of Patent: Nov. 26, 2024

(54) METHOD AND DEVICE FOR CORRECTING ERRORS IN RESISTIVE MEMORIES

(71) Applicant: COMMISSARIAT A L'ENERGIE ATOMIQUE ET AUX ENERGIES ALTERNATIVES, Paris (FR)

(72) Inventor: Valentin Gherman, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 176 days.

(21) Appl. No.: 18/077,122

(22) Filed: Dec. 7, 2022

(65) Prior Publication Data

US 2023/0187013 A1    Jun. 15, 2023

(30) Foreign Application Priority Data

Dec. 10, 2021   (FR) ...................... 2113306

(51) Int. Cl.
| G11C 13/00 | (2006.01) |
| G11C 29/02 | (2006.01) |
| G11C 29/52 | (2006.01) |
| G06F 11/10 | (2006.01) |
| G06F 11/14 | (2006.01) |

(52) U.S. Cl.
CPC ............ G11C 29/52 (2013.01); G11C 13/004 (2013.01); G11C 29/024 (2013.01); G06F 11/1048 (2013.01); G06F 11/141 (2013.01)

(58) Field of Classification Search
CPC ..... G11C 29/52; G11C 13/004; G11C 29/024; G06F 11/1048; G06F 11/141

USPC ...................................... 365/185.09
See application file for complete search history.

(56) References Cited

U.S. PATENT DOCUMENTS

| 11,237,906 | B1 * | 2/2022 | Laurent ................. H03M 13/31 |
| 2015/0212880 | A1 | 7/2015 | Carissimi et al. |
| 2016/0035417 | A1 | 2/2016 | Park et al. |
| 2017/0257121 | A1 * | 9/2017 | Kwok ................. H03M 13/451 |
| 2021/0067178 | A1 * | 3/2021 | Gherman ........... H03M 13/2942 |
| 2022/0035706 | A1 * | 2/2022 | Laurent ............... G06F 11/1012 |
| 2022/0342754 | A1 * | 10/2022 | Eisenhuth ............. G06F 3/0673 |
| 2023/0017565 | A1 * | 1/2023 | Molas ................. G11C 11/5614 |

OTHER PUBLICATIONS

Chen, et al., "Error-Correcting Codes for semiconductor memory applications: a state of the art review," IBM Journal of Research and Development, vol. 28, Issue 2, 1984.

Evain, et al., "Error Correction Schemes with Erasure Information for Fast Memories", Journal of Electronic Testing: Theory and Applications (JETTA), vol. 30, issue 2, Apr. 2014.

* cited by examiner

*Primary Examiner* — Ly D Pham
(74) *Attorney, Agent, or Firm* — BakerHostetler

(57) ABSTRACT

A solution for improving the correction of errors in a 2T2R resistive memory protected by an error correction code. A method that makes it possible, through 1T1R read operations, to identify, in a codeword stored in memory, bits liable to be incorrect, called "erasures", and then to invert these bits in the stored codeword in order to generate a new word corrected by the ECC.

12 Claims, 9 Drawing Sheets

METHOD AND DEVICE FOR CORRECTING ERRORS IN RESISTIVE MEMORIES

CROSS-REFERENCE TO RELATED APPLICATION

This application claims priority to foreign French patent application No. FR 2113306, filed on Dec. 10, 2021, the disclosure of which is incorporated by reference in its entirety.

FIELD OF THE INVENTION

The invention lies in the field of resistive random access memories, or RRAMs, and relates more particularly to a method and a device for improving the correction of errors in 2T2R resistive memories.

BACKGROUND

Resistive memories are non-volatile memories having a high operating speed, low electrical energy consumption and a long lifetime. For these reasons, resistive memories are promising candidates for replacing both random access memories and modern non-volatile memories, such as flash memories.

There are many resistive memory technologies. Mention may be made notably of conductive-bridging random access memories, also called CBRAM, or oxide-based random access memories, also called OxRAM, or even phase change memories, also called PCM.

A resistive memory consists of a multitude of resistive memory cells arranged in rows and columns so as to form a matrix. An RRAM memory cell is equipped with at least one resistive element the conductance of which is able to be modified.

Typically, an RRAM memory cell in its initial state has a metal-insulator structure and is in a high-resistance state (HRS). Before they are used, certain types of resistive memory, such as OxRAM or CBRAM memories, require electrical activation. Applying an external high-voltage pulse through the RRAM cell makes it possible to form conductive paths in the switching layer, and the RRAM cell is switched to a low-resistance state (LRS). The general process of this breakage of the metal-insulator structure of the cell is generally called "electroforming" (or "forming").

The dielectric material that is arranged between the two conductive electrodes of the cell will allow the cell to toggle reversibly between two HRS and LRS resistance states, each of the states allowing an information bit to be stored in the memory cell.

To program a memory cell, a programming voltage is applied between the electrodes of the memory cell. This may be a write voltage for writing to the memory cell, that is to say putting it into the LRS state, or an erase voltage for erasing the memory cell, that is to say putting it into the HRS state. However, following a programming operation, it may be the case that the memory cell does not change to the desired resistance state. For this reason, it is generally checked that the memory cell is programmed correctly by comparing its resistance value R with a predefined resistance threshold value $R_{REF}$.

FIG. 1a illustrates, in simplified form, an elementary resistive memory cell, generally consisting of a transistor (T) and of a resistive component (R) or resistor (102), in which an information bit is encoded by the value of the electrical resistance of the resistor. For these elementary cells, a logic '0' may for example be encoded by programming the resistor in an LRS state, and a logic '1' may then be encoded by programming the resistor in an HRS state, and reference is then made to encoding in 1T1R mode.

However, the difference between the lowest value corresponding to an HRS level and the highest value corresponding to the LRS level, also called "memory window", is often small. Use is therefore commonly made of "differential encoding" or 2T2R encoding to code a binary value to be stored. An information bit may then be encoded in what is called a 2T2R memory cell, as illustrated in simplified form in FIG. 1b and consisting of two elementary 1T1R cells, comprising 2 transistors (T1, T2) and 2 resistors (112-1, 112-2).

Since each of the HRS and LRS states may be associated with a logic value, i.e. 1 or 0, it may be considered, in a 2T2R cell, that one of the two resistive elements encodes the bit to be programmed as a non-inverted version, while the other resistive element encodes the same bit as an inverted version. For example, a logic '1' is encoded by programming the resistor of the first 1T1R cell in an HRS state and the resistor of the second 1T1R cell in an LRS state, and a logic '0' is encoded by programming the resistor of the first 1T1R cell in an LRS state and the resistor of the second cell in an HRS state.

Thus, in differential encoding, each information bit is encoded in an elementary 2T2R cell formed of two resistive elements that are written to in state opposition, that is to say one of the resistive elements with an HRS level and the other with an LRS level. The respective resistance levels of the two resistive elements are always determined in the same order between the two elements, and then define whether a logic '0' or a logic '1' is present, depending on whether this corresponds to the HRS-LRS state or to the LRS-HRS state.

During an operation of writing to a 1T1R memory cell or a 2T2R memory cell, it is necessary to ensure that each electrical resistance that is to be programmed in the HRS state or the LRS state is respectively either greater than or less than a reference value $R_{REF}$. An electrical resistance is compared with the value $R_{REF}$ through a read operation in which the programmed resistance is compared with the value $R_{REF}$ using a detection amplifier or SA (for "Sense Amplifier"), illustrated by the component 104 in FIG. 1a and 114 in FIG. 1b. Hereinafter, this read operation with comparison with a reference value is called 1T1R-mode read operation or 1T1 R read operation.

In FIG. 1a, the detection amplifier 104 reacts to the difference between its input 'SL' (stemming from the 1T1R cell) and its input '$R_{REF}$' (representative of a reference electrical resistance value $R_{REF}$), so as to generate an output signal '$V_{OUT}$' that indicates the resistive state of the memory element of the cell and provides information about the value that is stored in the 1T1R cell.

In FIG. 1b, the detection amplifier 114 will react to a difference on its inputs so as to generate an output signal '$V_{OUT}$'. In this implementation, a multiplexer (113-1, 113-2) is respectively coupled to the output (SL1, SL2) of each 1T1R cell in order to perform a 1T1R read operation through comparison with the reference value $R_{REF}$. In a 2T2R read operation, the output of each multiplexer corresponds to the value of each respective cell, and becomes an input for the detection amplifier 114. The output of the detection amplifier 114 then reacts to the difference in resistance between the two resistive elements of the 2T2R cell (112-1, 112-2) and provides information about the value that is stored in the selected 2T2R cell.

All of the read operations performed in 1T1R memories are performed in 1T1R mode. To efficiently read the data from the RRAM cell, a small read voltage that does not interfere with the current state of the cell is applied to determine the logic state of the cell.

In memories in which information is encoded in 2T2R mode, the read operations, apart from that of checking the programming, may be performed in 2T2R mode, also called differential-mode read operation or 2T2R read operation. The values of the two resistors present in each 2T2R memory cell that is addressed are compared with one another using a detection amplifier SA.

The use of a memory involves frequent transitions between an HRS state and an LRS state and vice versa, and each event of switching between these resistive states may introduce damage, the programmed resistance values possibly changing due to relaxation phenomena and then leading to degradation of the performance of the RRAM.

The time for which information is retained in a resistive memory then depends on (a) read operations, (b) use temperatures and/or (c) high magnetic fields in the case of magnetic memories.

In addition, switching voltages are also parameters that exhibit a high degree of variation. Resistance switching variations comprise temporal fluctuations (cycle-to-cycle) and spatial fluctuations (device-to-device).

Moreover, resistive memories also exhibit cell-to-cell non-uniformity that also degrades the performance of the memory by reducing the memory margin between two states. The origin of this variability is attributed to non-uniformities in the fabrication process, such as the thickness of the switching film, damage caused by etching and the surface roughness of the electrodes.

These variations mean that the resistors of the resistive memories that are programmed in the LRS state may drift to an HRS state, and the resistors that are programmed in the HRS state may drift to an LRS state. This sliding of the programmed resistance values may therefore lead to errors during read operations and reduce the performance of the memories.

One common way of improving the performance of RRAM memories is to reduce their error rate. To reduce the error rate of memories, one commonly used solution consists in using an error correction code or ECC that encodes the data before they are written to memory. When encoding data with an ECC, check bits are added to the data bits, the check bits representing redundant information computed based on the data bits, which makes it possible to detect and correct errors affecting both the data bits and the check bits. The set of data bits and check bits forms a codeword.

Patent application US 2015/212880 A1 by Carissimi Marcella et al. discloses an ECC-based error correction solution performed in a 1T1R resistive memory.

In the presence of a high error rate, one solution is to use increasingly powerful ECCs. However, this leads to an extra cost in terms of storage surface for the check bits and in terms of footprint, latency and consumption of the ECC decoder.

One approach for avoiding the use of a powerful ECC is to reduce the primary error rate, that is to say the error rate at the output of the memory circuit that would be obtained without using an ECC. To reduce the primary error rate, one method consists in using 2T2R memories rather than 1T1R memories. However, there are still some cases where, even with the use of a 2T2R memory, the primary error rate remains high.

Therefore, in these situations, or even those where it would be necessary to choose an ECC with a smaller extra cost and therefore a worse correction capability, one known solution is to identify cells that are in a state that could be considered to be weak, that is to say cells liable to deliver an incorrect bit, these bits being designated as an "erasure", and then to use this information to improve error correction.

The article by C. L. Chen and M. Y. Hsiao, "Error-Correcting Codes for semiconductor memory applications: a state of the art review," IBM Journal of Research and Development, volume 28, issue 2, 1984, discloses a method for detecting memory cells that are affected by stuck-at faults. Any bit read from such a cell is considered to be an erasure. Following the detection of a number of non-correctable errors in a memory word, this type of erasure may be detected by an operation of writing the inverted word followed by a read operation at the same memory address. Any bit that does not change value following the writing of the inverted word is then considered to be an erasure. Following the error correction improved by the identification of erasures, the corrected word, which is inverted a second time, is always stored at the same address in the memory. This method makes it possible to identify only very specific erasures, i.e. those associated with bits stored in memory cells that are not working.

The article by S. Evain, V. Savin and V. Gherman, "Error Correction Schemes with Erasure Information for Fast Memories," Journal of Electronic Testing: Theory and Applications (JETTA), volume 30, issue 2, from April 2014, describes a method and devices for memories that make it possible to increase the correction capability of an ECC based on the identification of erasures. This method uses the identification of erasures by additional read operations, which compare a read value with various reference values. This method requires the memory circuit to be modified due to the need to add additional multiplexers upstream of each detection amplifier, for the purpose of choosing additional reference values.

Therefore, faced with the general problem of the drifting of resistance values in RRAM resistive memory cells, and faced with the limits of known solutions based on the use of an error correction code, there is the need for a solution for reducing read errors in RRAM resistive memories, in particular in 2T2R RRAM memories.

SUMMARY OF THE INVENTION

The present invention addresses this need.

The invention targets a solution for improving the correction of errors in resistive memories protected by an error correction code.

Generally speaking, the principle of the invention is based on a method that makes it possible to identify, in a codeword programmed in a 2T2R resistive memory protected by an error correction code, bits that are liable to be incorrect, called one or more weak bits or "erasures", and then to invert these bits in order to generate a new word that is able to be corrected by the decoder of the error correction code.

Advantageously, the method of the present invention does not require the memory matrix to be modified. The proposed method has no impact on the write operations to the resistive memories in question.

The aim of the invention is thus to overcome the drawbacks of the known solutions with a solution that does not require any operations involving the use of additional reference values.

To achieve the desired aim, what is proposed is a method for correcting errors in a codeword stored in a 2T2R resistive memory, a codeword consisting of data bits and check bits, the 2T2R resistive memory comprising a matrix of elementary 2T2R resistive memory cells in which each elementary cell comprises two transistors and two resistive elements for storing the non-inverted value and the inverted value of a bit, and for reading the stored bits in differential mode, the differential-mode read operation or 2T2R read operation consisting in comparing, with one another, the values of the first and second resistive element of the elementary cell used to store each bit of a word at an indicated address in order to determine the read value. The method comprises at least the steps of:

determining, following an error correction operation performed by an error correction code coupled to the resistive memory, that a codeword read in 2T2R read mode contains non-corrected errors that affect a number of bits greater than a predefined threshold;
 performing at least one single-mode read operation or 1T1R read operation on the stored codeword, consisting in comparing, with a reference value $R_{ERASURE}$, the value of one of the two resistive elements of the addressed elementary cells for each bit of the codeword, in order to determine the read value;
 comparing, for each bit of the codeword, the value read by said at least one 1T1R read operation with the value read in 2T2R read mode in order to identify bits liable to be incorrect, said bits liable to be incorrect being:
  bits for which the value read in 1T1R read mode is identical to the value read in 2T2R read mode, if said at least one 1T1R read operation is performed on the resistive elements of the elementary cell encoding the inverted values of the bits; or
  bits for which the value read in 1T1R read mode is different from the value read in 2T2R read mode, if said at least one 1T1R read operation is performed on the resistive elements of the elementary cell encoding the non-inverted values of the bits;
 inverting, in said codeword read in 2T2R read mode, said bits identified as liable to be incorrect; and
 correcting said codeword obtained following the inversion step with the error correction code.

According to some alternative or combined embodiments:

The step of determining that a codeword contains non-corrected errors that affect a number of bits greater than a predefined threshold consists in determining that said number of affected bits is equal to the maximum number of incorrect bits that the decoder of the error correction code is able to detect in a codeword.

The steps of performing a 1T1R read operation and of comparing the read value consist in: performing a first 1T1R read operation on each first resistive element of the addressed elementary cells for each bit of the codeword, in order to determine a first read value; performing a second 1T1R read operation on each second resistive element of the addressed elementary cells for each bit of the codeword, in order to determine a second read value; and comparing the first value read in 1T1R mode with the second value read in 1T1R mode in order to identify bits liable to be incorrect as being bits for which the first read value and the second read value are identical.

The method comprises, prior to the decoding step, a step of storing the value of each bit of the codeword read in 2T2R mode in a register coupled to the resistive memory.

The step of correcting the codeword obtained following inversion comprises steps of:

storing the value of each bit of said codeword obtained following inversion in a register coupled to the resistive memory;
 correcting said stored codeword using the error correction code; and
 storing the corrected codeword in the output register of the decoder of the error correction code.

The comparison step comprises steps of:

storing the value of each bit read in 1T1R mode in a register coupled to the resistive memory; and
 comparing the value of each stored bit with the value of each bit of the codeword read in 2T2R mode.

The step of performing at least one 1T1R-mode read operation consists in comparing the read value with a reference value $R_{ERASURE}$, which may be identical to the reference value used to program the elementary cells of the resistive memory.

Another subject of the invention is a computer program comprising code instructions for executing the steps of the error correction method when said program is executed by a processor.

The invention also covers an error correction device comprising means for implementing the steps of the method for correcting errors in a codeword stored in a 2T2R resistive memory as claimed.

In one embodiment, the error correction code is a SEC-DED circuit.

In one variant embodiment, the error correction code is a DEC-TED circuit.

Another subject of the invention covers any FPGA or ASIC electronic system comprising an error correction device as claimed.

BRIEF DESCRIPTION OF THE DRAWINGS

Other features, details and advantages of the invention will become apparent upon reading the description given with reference to the appended drawings, which are given by way of example and in which, respectively.

DETAILED DESCRIPTION

Figure 1A:
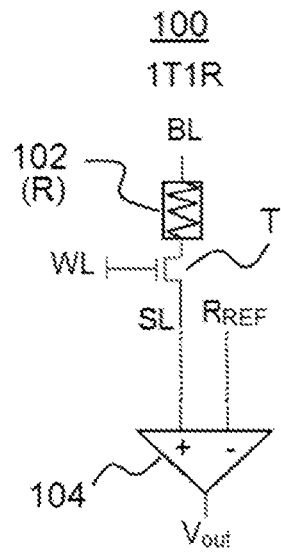
FIG. 1a and FIG. 1b respectively illustrate exemplary implementations of a 1T1R memory cell and of a 2T2R memory cell.
Figure 1B:
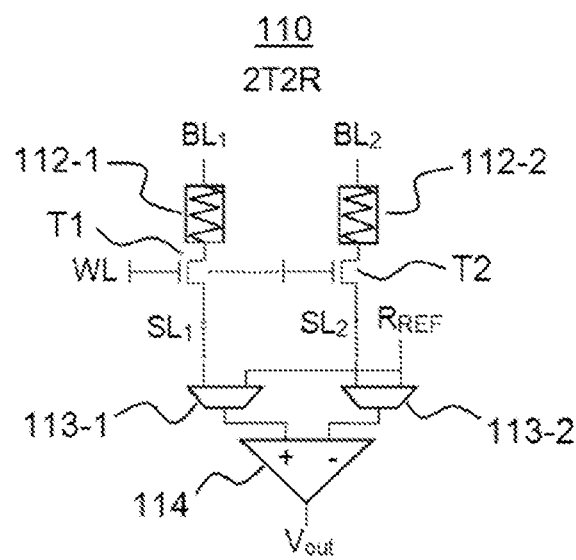
Figure 2:
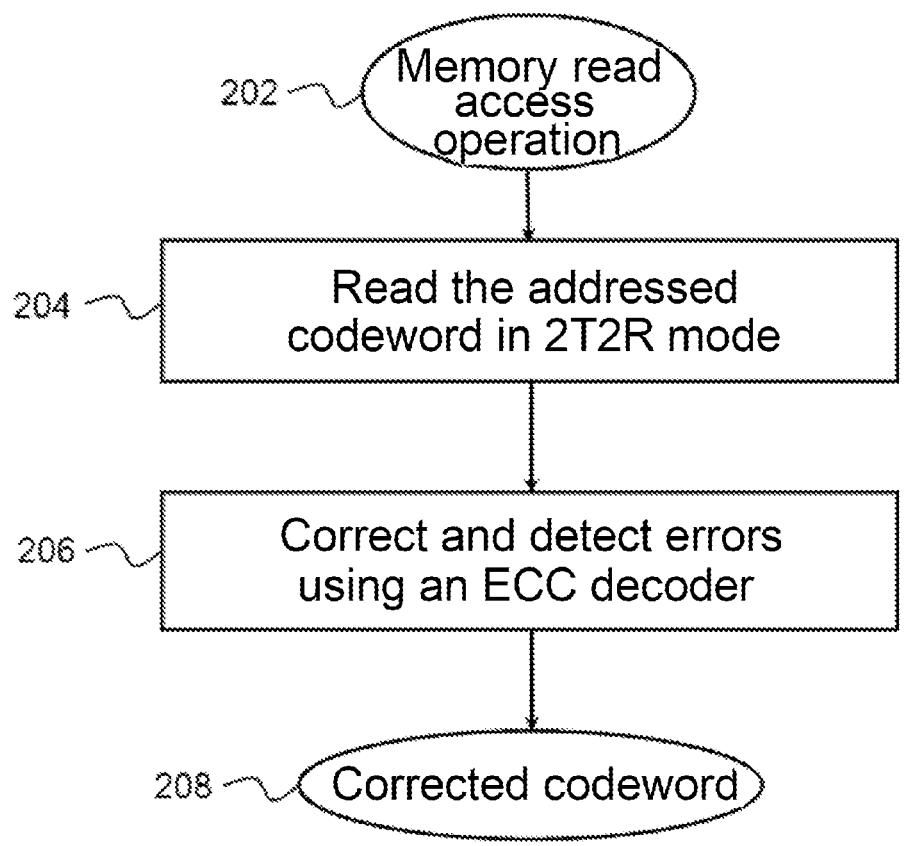
FIG. 2 illustrates the steps of a conventional method for reading from a 2T2R memory protected by an ECC.

FIG. 2 illustrates the steps of a conventional method for reading from a 2T2R memory protected by an error correction code (ECC). The method 200 begins with a step 202 of receiving a read command to access a codeword stored at a given address, the codeword consisting of data bits and check bits.

After the codeword has been read 204 in 2T2R mode at the address indicated by the read command, in a following step 206, the decoder of the ECC is used conventionally (i.e. the decoder seeks to locate errors but does not use information about any erasures) to detect and correct incorrect bits in the read codeword.

Depending on the type of ECC and the number of errors, all of the incorrect bits may or may not be corrected, and, following ECC decoding step 206, a corrected codeword is available in which all of the data bits may be made available to the electronic system that initiated the read command.

Without limitation, one known ECC is the SEC-DED (acronym for "Single Error Correction-Double Error Detection") circuit, which makes it possible to correct errors on a single bit (SEC) and to detect errors on two bits (DED). Those skilled in the art may refer to the numerous documents available in the literature that describe various types of error correction code circuit and error correction and detection mechanisms using an ECC.

Figure 3:
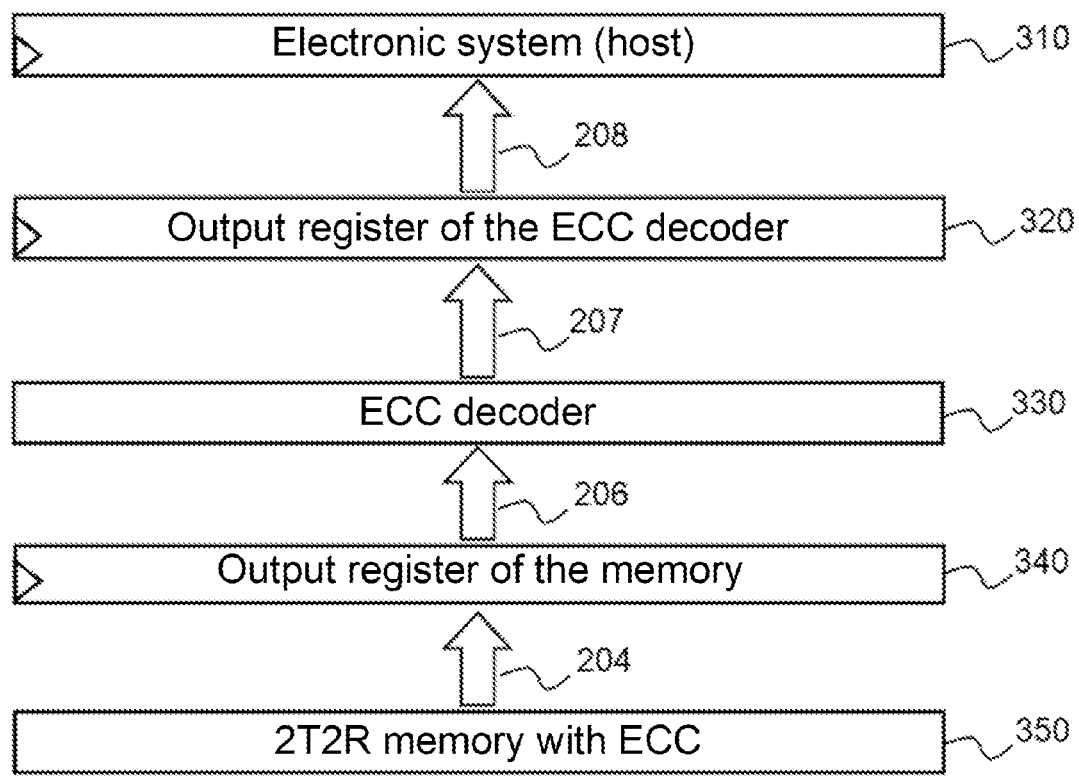
FIG. 3 illustrates a general system for implementing the steps of a conventional method for reading from a 2T2R memory protected by an ECC.

FIG. 3 illustrates a general system for implementing the steps of a conventional method for reading from a 2T2R memory protected by an ECC, such as the method described with reference to FIG. 2.

The memory read commands are initialized from a host electronic system 310. The electronic system 310 may be a circuit based on processors, on multiprocessors, on FPGAs (acronym for "Field-Programmable Gate Array") or on ASICs (acronym for "Application Specific Integrated Circuit").

In one embodiment, the electronic system 310 may be a memory controller implemented in a storage system.

The bits of the codeword read from the 2T2R memory 350 are stored in an output register 340 of the memory. The 2T2R resistive memory 350 may be organized into a matrix of elementary 2T2R resistive memory cells in which each elementary cell comprises two transistors and two resistive elements for encoding the non-inverted value and the inverted value of a bit, by programming one of the two resistors in LRS and the other in HRS, and for performing a 2T2R read operation on the encoded bits.

The read bits are transferred from the memory to an ECC decoder 330 in order to correct any errors that occurred during storage thereof and/or reading thereof. Following the ECC decoding operation, the data bits of the corrected codeword may be stored in an output register 320 of the ECC decoder, and made available to the electronic system 310.

Figure 4:
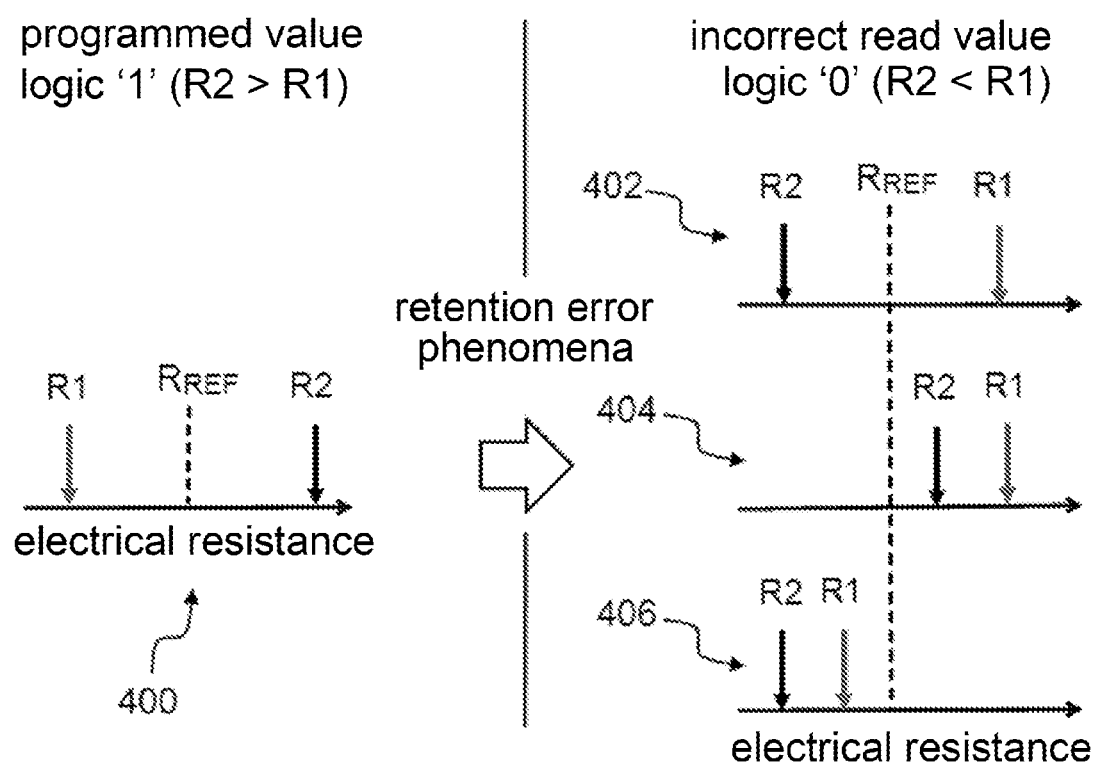
FIG. 4 illustrates the drift in the values of the resistors of a 2T2R resistive memory cell.

As explained above, the resistance values of each resistive element of an elementary 2T2R cell may drift over time. FIG. 4 illustrates possible drifts in the values of the two resistors R1 and R2 of a 2T2R memory cell.

To explain these drifts, it may be assumed that a logic '1' is stored in a 2T2R cell, by programming the first resistor R1 to a low-resistance state (LRS) and by programming the second resistor R2 to a high-resistance state (HRS), such that "R2>R1".

During a write operation to memory, the resistors R1 and R2 that have been programmed should each be checked in 1T1R mode against a reference value ($R_{REF}$).

Depending on the indicated programming, the 1T1R read operation on the first cell should return the fact that the read value is less than the reference value "R1<$R_{REF}$", and the 1T1R read operation on the second cell should return the fact that the read value is greater than the reference value "R2>$R_{REF}$", as illustrated by the reference 400.

As storage time increases, the values of the resistors R1 and R2 may drift such that the condition "R2>R1" is no longer valid. An incorrect logic '0' may then be detected for a differential-mode read operation from the 2T2R memory, rather than the initially programmed logic '1'.

The right-hand part of FIG. 4 shows three possible scenarios in which the condition R2>R1 becomes invalid. In the first scenario 402, the resistances R1 and R2 have drifted such that "R2<R1" with "R1>$R_{REF}$" and "R2<$R_{REF}$", that is to say that the two resistances are positioned on either side of the reference value.

In the second scenario 404, the resistances R1 and R2 have drifted such that "R2<R1" but with "R1>$R_{REF}$" and "R2>$R_{REF}$", that is to say that the two resistances are greater than the reference value.

In the third scenario 406, the resistances R1 and R2 have drifted such that "R2<R1" but with "R1<$R_{REF}$" and "R2<$R_{REF}$", that is to say that the two resistances are smaller than the reference value.

According to the method of the invention, the drift cases illustrated by the second and third scenarios will be identified in order to improve the error correction. Indeed, identifying that the values of the two resistors R1 and R2 of one and the same 2T2R cell are "positioned" on the same side as the reference value indicates that at least one of these resistors R1 or R2 has been subjected to significant drift, or even both resistors have been able to drift, and this may therefore lead to an incorrect 2T2R read operation.

The general principle of the invention thus consists in identifying bits for which one or both resistance values have drifted such that the two values are either greater than or less than a reference value. Such situations do not necessarily indicate that the bits that have been programmed will be detected in error in a differential-mode read operation, but identifying them indicates that they are liable to be incorrect. These bits are considered to be weak bits and are designated as being "erasures".

Erasures are identified by the method of the invention by performing, in one embodiment, at least one 1T1R-mode read operation on one of the two 1T1R cells of an elementary 2T2R cell. The 1T1R read operation makes it possible to compare, with a reference value, the value of one of the two resistive elements of the elementary cell that is addressed, and to determine whether the read value has drifted with respect to the reference value.

Figure 5:
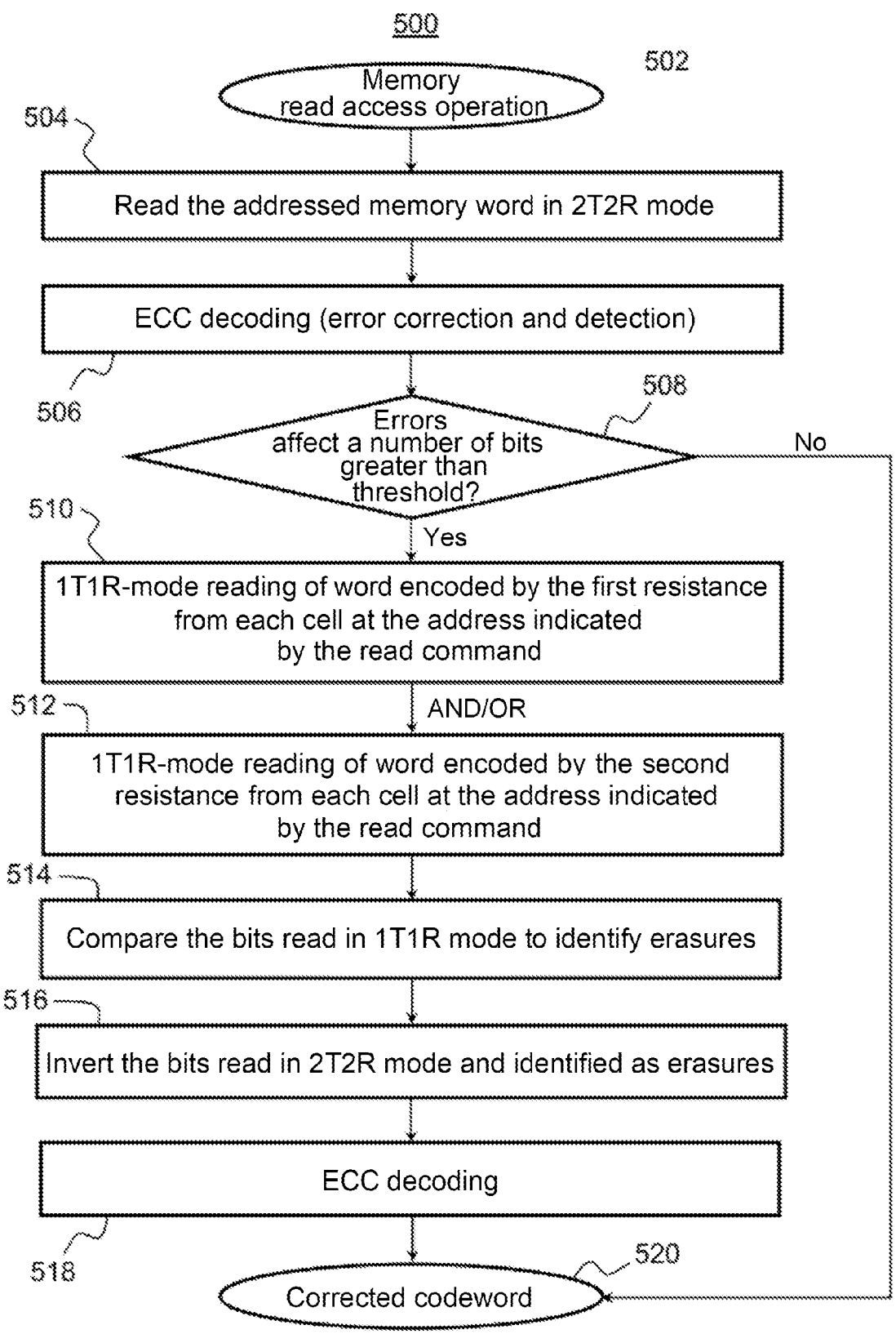
FIG. 5 illustrates the steps of the error correction method of the invention in one embodiment.

FIG. 5 illustrates the steps of the error correction method of the invention in one embodiment. The method 500 performed for a 2T2R memory protected by an ECC makes it possible to improve the correction of errors by identifying erasures.

The initial steps of the method are identical to those of a conventional method, as described with reference to FIG. 2, specifically a step 502 of accessing an address of the 2T2R memory storing a codeword, a step 504 of reading the codeword stored at the read address, and a step 506 of implementing an error correction and detection mechanism using an ECC coupled to the memory.

In a following step 508, the method makes it possible to check whether the ECC decoder indicates the presence of errors that affect a number of bits greater than a predefined threshold.

In one embodiment, the value of the threshold is set such that the number of bits affected by an error does not exceed the maximum number of incorrect bits able to be corrected by the ECC decoder that is used, this being equivalent to determining that said number of affected bits is equal to the maximum number of incorrect bits that the ECC decoder is able to detect in a codeword.

If the number of affected bits remains below the threshold (No branch in 508), the method ends conventionally with a step 520 with the provision of a codeword corrected only by the ECC that is used conventionally.

If the number of affected bits is greater than the predefined threshold (Yes branch in 508), the method continues with a mechanism for identifying erasures and correcting incorrect bits.

In one embodiment, the method comprises, prior to the decoding step 506, a step of storing the value of each bit of the codeword read in 2T2R mode in a register coupled to the resistive memory.

In one embodiment, the method makes it possible to perform at least one 1T1R read operation (step 510 or 512) from each addressed elementary 2T2R cell, which consists in comparing the value of one of the two resistive elements of the addressed elementary 2T2R cells with a reference value '$R_{ERASURE}$', in order to determine the read value.

In one embodiment (step 510), a 1T1R read operation is performed at the address indicated by the read command, on the resistive elements of each elementary 2T2R cell encoding the inverted values of the bits.

In another embodiment (step 512), a 1T1R read operation is performed at the address indicated by the read command, on the resistive elements of each elementary 2T2R cell encoding the non-inverted values of the bits.

The method continues with a step 514 of comparing the bits read in 1T1R read mode (step 510 or 512) with the bits read in 2T2R read mode (step 504).

The comparison is performed for each bit of the codeword stored at the read address in order to identify bits liable to be incorrect, said bits liable to be incorrect being:
- bits for which the value read in 1T1R read mode is identical to the value read in 2T2R read mode, if the 1T1R read operation is performed on the resistive elements of the elementary cell encoding the inverted values of the bits; or
- bits for which the value read in 1T1R read mode is different from the value read in 2T2R read mode, if the 1T1R read operation is performed on the resistive elements of the elementary cell encoding the non-inverted values of the bits.

In one embodiment, comparison step 514 comprises steps of:
- storing the value of each bit read in 1T1R mode in a register coupled to the resistive memory; and
- comparing the value of each stored bit with the value of each bit of the codeword read in 2T2R mode.

Following step 514 of identifying erasures, the method continues with a step 516 of inverting said bits identified as liable to be incorrect in the corrected codeword, and then a step 518 of correcting and detecting errors using the ECC, in order to generate 520 a new corrected codeword.

In one embodiment in which the comparison of the values read in 1T1R mode with the values read in 2T2R mode does not identify a number of erasures sufficient to release the ECC decoding, the method allows reading, in 1T1R mode, of the other resistor used for the 2T2R-mode encoding.

Thus, in one embodiment, the step of performing at least one 1T1R read operation may consist in performing a first 1T1R read operation (step 510) on each first resistive element of the addressed elementary cells, in order to determine a first read value, and in performing a second 1T1R read operation (step 512) on each second resistive element of the addressed elementary cells, in order to determine a second read value.

In this embodiment, the two electrical resistors of a 2T2R cell are considered to have been programmed such that one is smaller and the other is greater than a reference value $R_{REF}$ (used in a previous memory write operation). Therefore, by comparing, in two 1T1R-mode read operations, each electrical resistance value with one and the same reference value $R_{ERASURE}$, opposing logic values should be read from each addressed 2T2R cell during read steps 510 and 512.

In this embodiment with a double 1T1R read operation, the step of comparing to identify bits liable to be incorrect consists in comparing the first value read in 1T1R mode with the second value read in 1T1R mode. Identifying bits liable to be incorrect consists in determining bits for which the first value read in 1T1R read mode and the second value read in 1T1R read mode are identical. Indeed, if, for a 2T2R cell, the two values read in 1T1R read mode are identical, it may be considered that at least one of the two electrical resistors has been subject to significant drift since it was programmed in a low-resistance state or a high-resistance state. Therefore, the bit read in 2T2R mode from these two resistors was possibly evaluated incorrectly, and it may then be considered to be an erasure.

Following the double 1T1R read operation and identification of the erasure bits, the method continues with steps 516 of inverting bits in the codeword read in 2T2R mode, of decoding 518 using the ECC and of obtaining 520 a corrected codeword.

The data bits of the new corrected codeword may be made available to the electronic system 310 that initiated the read command.

In one embodiment, step 518 of correcting the codeword obtained following inversion comprises steps of:
- storing the value of each bit of said codeword obtained following inversion in a register coupled to the resistive memory;
- correcting said stored codeword using the error correction code; and
- storing the corrected codeword in the output register of the ECC decoder.

If the ECC encoder still indicates a non-correctable error, the memory controller may signal a read error to the electronic system.

Advantageously, the reference value $R_{ERASURE}$ used during the one or more 1T1R-mode read operations is identical to the reference value $R_{REF}$ used during a programming operation in a 2T2R memory (which is performed to ensure that the electrical resistors are correctly programmed to LRS or HRS).

Figure 6:
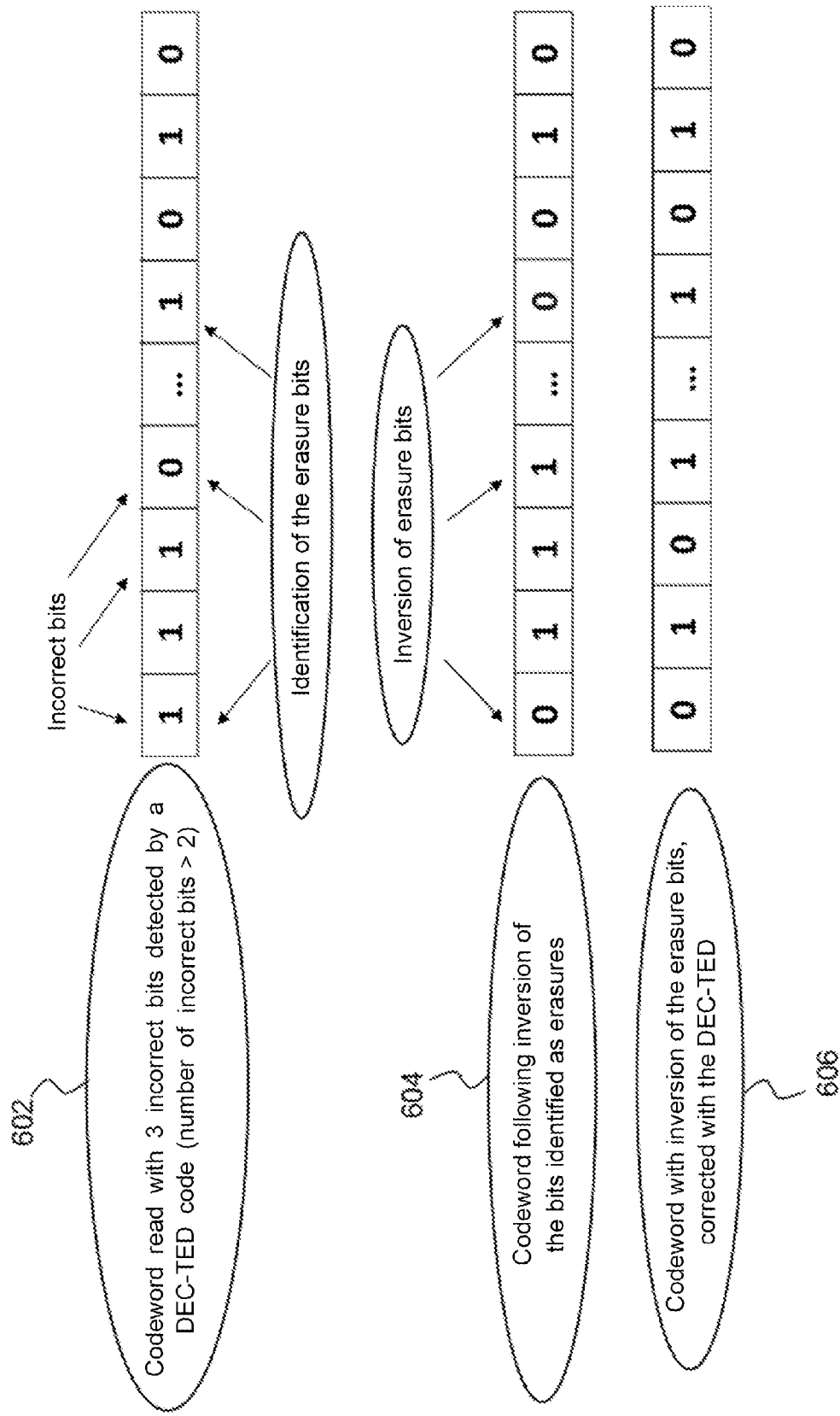
FIG. 6 shows one example of a codeword corrected by the method of the invention.

FIG. 6 illustrates one example of a codeword corrected by the method of the invention.

In the top part of the figure, a word 602 of a DEC-TED code (allowing the correction of single and double errors and the detection of triple errors) is read with three incorrect bits. In the example, the codeword (1, 1, 1, 0, . . . , 1, 0, 1, 0) indicates that the first '1', the third '1' and the fourth '0' bit are incorrect. The DEC-TED decoder makes it possible to detect the presence of the three incorrect bits, but not their position. The number of errors '3' in this example is greater than the threshold, equal to 2, permitted by the DEC-TED in order to be able to correct them.

The steps (510, 512, 514) of the method of the invention make it possible to identify erasures in the codeword 602, i.e. the first bit '1', the fourth bit '0' and the nth bit '1'.

Step 516 of the method of the invention makes it possible to invert the erasure bits, and the codeword 604 becomes (0, 1, 1, 1, ..., 0, 0, 1, 0).

Steps 518 and 520 of the method of the invention make it possible to correct the codeword 604 and obtain a new corrected codeword 606 (0, 1, 0, 1, ..., 1, 0, 1, 0), which, in this example, no longer contains any incorrect bits.

The inventors have found that, for codewords with 32 data bits, using a SEC-DED ECC rather than a DEC, and using a DEC-TED ECC rather than a TEC, makes it possible to reduce the number of check bits per codeword by 42% and 28%, respectively.

Figure 7:
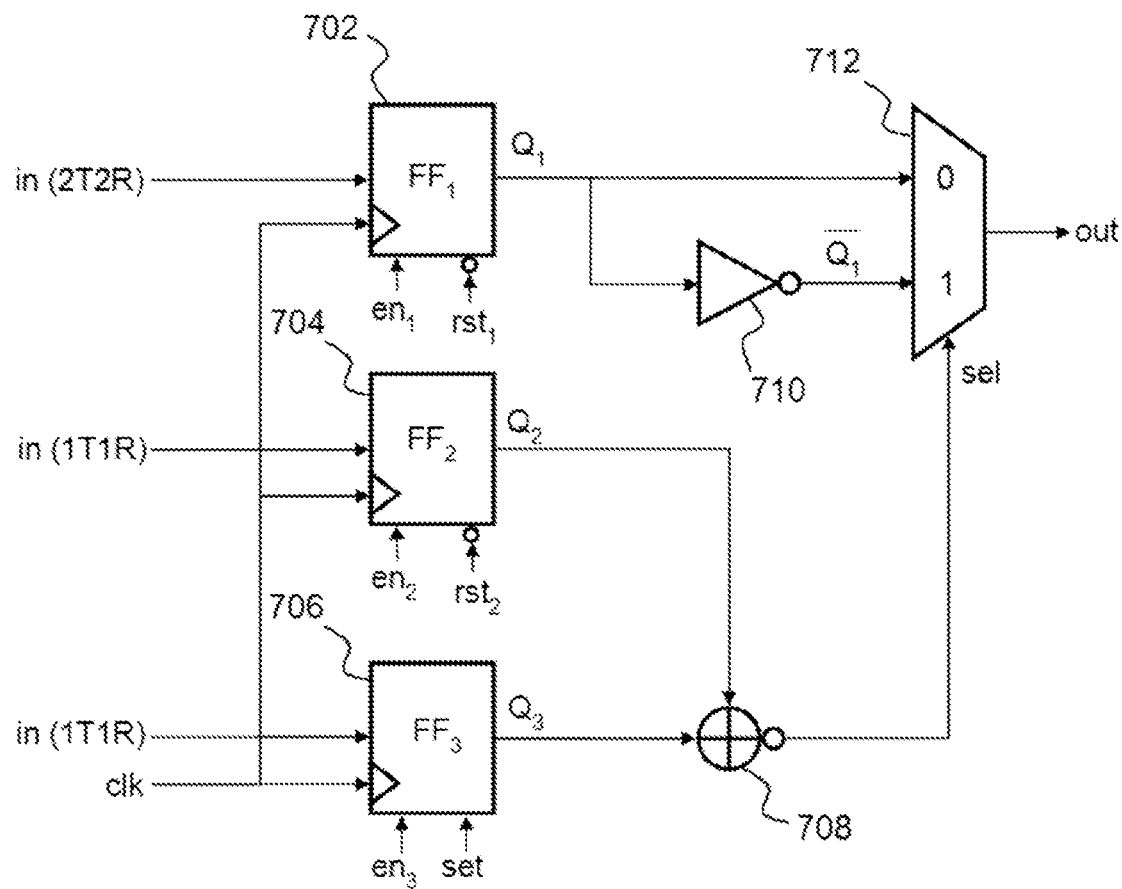
FIG. 7 illustrates one embodiment of a circuit for inverting bits identified as erasures.

FIG. 7 illustrates one embodiment of a circuit 700 for inverting bits read in 2T2R mode and identified as erasures through the comparison of the two values read in 1T1R mode. The circuit 700 may be used to replace each flip-flop of an output register of the 2T2R memory, for example the output register 340 from FIG. 3.

The bit inversion circuit primarily comprises three synchronous flip-flops (702, 704, 706). A first flip-flop 702 may receive, on its input in (2T2R), a bit read in 2T2R mode from the memory corresponding to step 504, a second flip-flop 704 may receive, on its input in (1T1R), one of the bits read in 1T1R mode corresponding to step 510, and a third flip-flop 706 may receive, on its input in (1T1R), the other bit read in 1T1R mode corresponding to step 512.

The flip-flops are clocked by a clock signal 'clk', and may be initialized by 'set' and 'reset' signals (respectively 'rst$_1$' for the first flip-flop 702, 'rst$_2$' for the second flip-flop 704, and 'set' for the third flip-flop 706). Each flip-flop is controlled by a signal 'en' generated by a memory controller, respectively 'en$_1$' for the first flip-flop 702, 'en$_2$' for the second flip-flop 704, 'en$_2$' for the third flip-flop 706.

Figure 8:
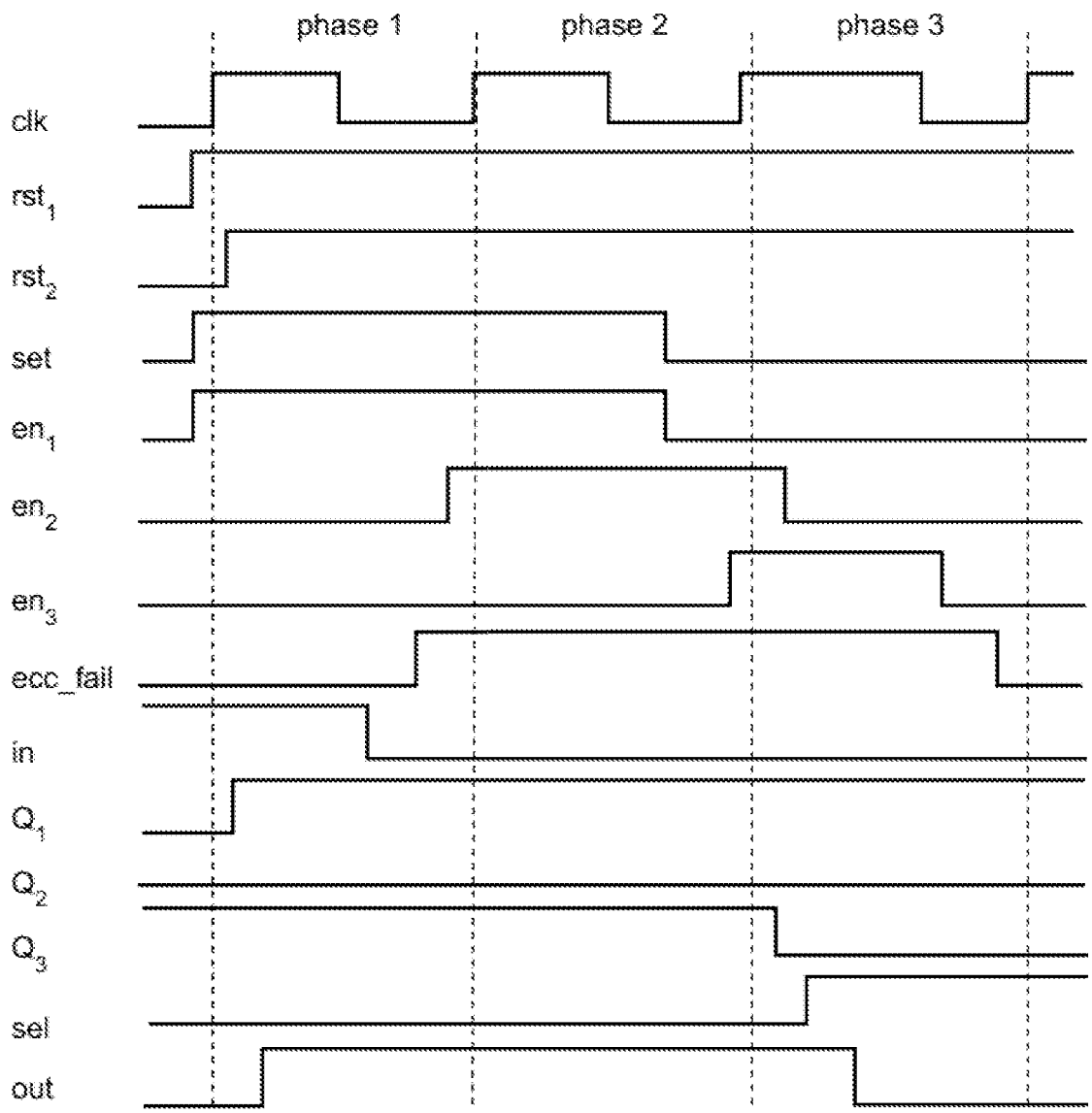
FIG. 8 is a timing diagram of various signals operating on the circuit of FIG. 7.

FIG. 8 shows a timing diagram of the various signals operating on the circuit of FIG. 7.

The output $Q_1$ of the first flip-flop 702 is coupled firstly to a first input of a multiplexer 712 and secondly to the input of an inverter 710, which is used to supply an inverted version of the bit stored in the first flip-flop 702. The output $\overline{Q_1}$ of the inverter 710 becomes the second input of the multiplexer 712.

The outputs $Q_2$ and $Q_3$ of the second and third flip-flops 704 and 706 become the inputs of an XNOR logic gate 708. The output of the XNOR logic gate 708 becomes a selection signal 'sel' for the multiplexer 712. The value at the output of the XNOR logic gate 708 is a logic '1' only when its two inputs are identical, i.e. corresponding to the bits respectively stored in the second and the third flip-flop 704 and 706.

The multiplexer 712 makes it possible to select and deliver a signal 'out' corresponding to the inverted value or to the non-inverted value of the bit stored in the first flip-flop 702, as a function of the logic value supplied by the XNOR gate 708, and therefore of the value of the selection signal 'sel'.

In this embodiment, the second flip-flop 704 and the third flip-flop 706 are initialized at different values at the start of each access operation to the 2T2R memory.

In one variant embodiment of the inversion circuit, the flip-flops 702, 704 and 706 may be replaced by latches.

Those skilled in the art will be able to consider other different implementation variants of the inversion circuit.

For each of the signals depicted on the timing diagram of FIG. 8, it is considered that a high or low value represents a logic '1' or a logic '0', respectively.

The first flip-flop 702 and the second flip-flop 704 may be initialized at 0 if the signal 'rst$_1$', respectively 'rst$_2$', has the value 0 during the rising edge of the clock signal 'clk'. The third flip-flop 706 may be initialized at 1 if the signal 'set' is equal to 1 during the rising edge of the clock signal 'clk'.

If not, each of these three flip-flops may change its state as a function of the input signal 'in' only if its control signal 'en' is equal to '1' during the rising edge of the clock signal 'clk'.

On the timing diagram of FIG. 8, a first phase 'phase 1' reflects the reading of the first flip-flop (the signal 'en$_1$' equal to '1' during the rising edge of the signal 'clk'), the output $Q_1$ of which becomes logic '1'. When the signal 'ecc_fail' supplied by the ECC decoder indicates the presence of a non-correctable error, phases 2 and 3 (i.e. corresponding to the implementation of steps 510 to 514) are executed. In the example of the timing diagram of FIG. 8, the signal 'ecc_fail' changes to '1' to reflect the fact that the result of step 508 indicates that there are still errors affecting a number of bits greater than the predefined threshold.

During phase 2, the 1T1R-mode read operation (the signal 'en$_2$' equal to '1' during the rising edge of the signal 'clk') supplies the value of the output $Q_2$ of the second flip-flop 704, which is a logic '0'.

During phase 3, the 1T1R-mode read operation (the signal 'en$_3$' equal to '1' during the rising edge of the signal 'clk') supplies the value of the output $Q_3$ of the third flip-flop 706, which is a logic '0'.

In this example, the bit read in differential mode is equal to '1' and the two bits read in 1T1R mode are equal to '0', thereby indicating that the bit read in differential mode may be identified as an erasure.

The last line of the timing diagram reflects the value of the output signal 'out', which toggles so as to invert the value of the bit identified as an erasure.

Figure 9:
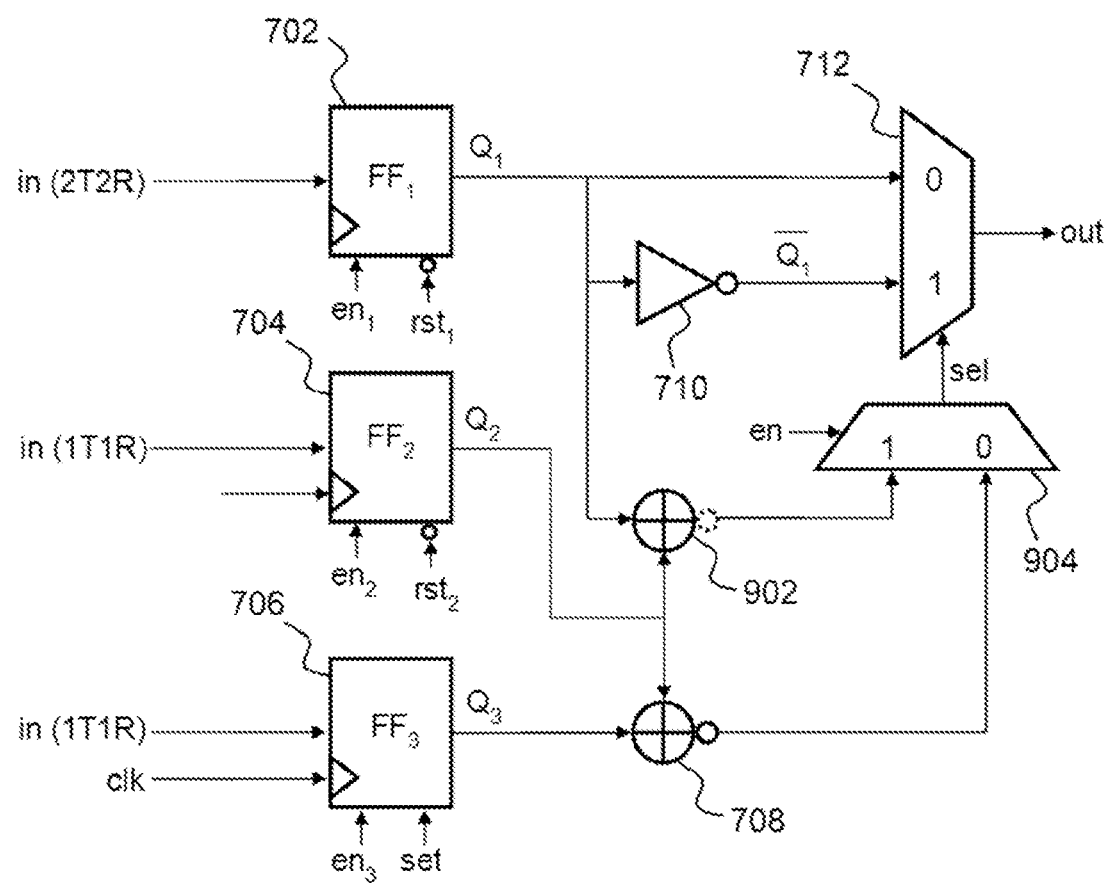
FIG. 9 illustrates another embodiment of a circuit for inverting bits identified as erasures.

FIG. 9 illustrates another embodiment of a circuit 900 for inverting bits identified as erasures according to the method of the invention. Elements in common with the circuit presented in FIG. 7 retain the same references and are not described again. Like for the circuit 700 of FIG. 7, this device 900 for inverting erasure bits replaces each conventional flip-flop in the output register 340 of the resistive memory.

In this variant embodiment, the circuit comprises a second XNOR logic gate 902 and a second multiplexer 904 as well. The second XNOR logic gate 902 takes, at input, the output of the first flip-flop 702 and the output of the second flip-flop 704 in order to compare them. The second multiplexer 904 takes, at input, the output of the first XNOR gate 708 and the output of the second XNOR gate 902, in order to deliver a selection signal 'sel' to the first multiplexer 712, when it is activated by a control signal 'en'.

During operation, it is considered for example that the first value read in 1T1R mode is stored in the second flip-flop 704 and that this value is compared with the value read in 2T2R mode that is stored in the first flip-flop 702. If the first value read in 1T1R mode was programmed so as to encode the inverted version of the bits programmed in the 2T2R cell, then the logic gate that performs the comparison should be an XNOR gate, as in the example of FIG. 9.

Similarly, if the first value read in 1T1R mode was programmed so as to encode the non-inverted version of the bits programmed in the 2T2R cell, then the logic gate that performs the comparison should be an XOR gate (not illustrated).

The second multiplexer 904 is driven by a signal 'en' generated by the memory controller. In this embodiment, there may be provision to have the signal 'en' equal to a logic '1' only during the cycle in which the values of the first flip-flop 702 and of the second flip-flop 704 are compared.

The present description illustrates one preferred but non-limiting implementation of the invention. Some examples have been chosen to allow a good understanding of the principles of the invention and a specific application, but these are in no way exhaustive and are intended to allow those skilled in the art to provide modifications and implementation variants for the various circuits while retaining the same principles. In some variant embodiments, each encoding, counting, comparison and inversion functional module may be implemented by a dedicated module such as an ASIC.

The invention may be implemented based on hardware and/or software elements. It may be available in the form of a computer program product executed by a dedicated processor or by a memory controller of a storage system and comprising code instructions for executing the steps of the methods in their various embodiments.

The invention claimed is:

1. A method for correcting errors in a codeword stored in a 2T2R resistive memory, a codeword consisting of data bits and check bits, the 2T2R resistive memory comprising a matrix of elementary 2T2R resistive memory cells wherein each elementary cell comprises two transistors and two resistive elements for storing the non-inverted value and the inverted value of a bit, and for reading the stored bits in differential mode, the differential-mode read operation or 2T2R read operation consisting in comparing, with one another, the values of the first and second resistive element of the elementary cell used to store each bit of a word at an indicated address in order to determine the read value, the error correction method comprising at least the following steps:
   determining, following an error correction operation performed by an error correction code coupled to the resistive memory, that a codeword read in 2T2R read mode contains non-corrected errors that affect a number of bits greater than a predefined threshold;
   performing at least one single-mode read operation or 1T1R read operation on the stored codeword, consisting in comparing, with a reference value $R_{ERASURE}$, the value of one of the two resistive elements of the addressed elementary cells for each bit of the codeword, in order to determine the read value;
   comparing, for each bit of the codeword, the value read by said at least one 1T1R read operation with the value read in 2T2R read mode in order to identify bits liable to be incorrect, said bits liable to be incorrect being:
      bits for which the value read in 1T1R read mode is identical to the value read in 2T2R read mode, if said at least one 1T1R read operation is performed on the resistive elements of the elementary cell encoding the inverted values of the bits; or
      bits for which the value read in 1T1R read mode is different from the value read in 2T2R read mode, if said at least one 1T1R read operation is performed on the resistive elements of the elementary cell encoding the non-inverted values of the bits;
   inverting, in said codeword read in 2T2R read mode, said bits identified as liable to be incorrect; and
   correcting said codeword obtained following the inversion step with the error correction code.

2. The method according to claim 1, wherein the step of determining that a codeword contains non-corrected errors that affect a number of bits greater than a predefined threshold consists in determining that said number of affected bits is equal to the maximum number of incorrect bits that the decoder of the error correction code is able to detect in a codeword.

3. The method according to claim 1, wherein the steps of performing a 1T1R read operation and of comparing the read value consist in:
   performing a first 1T1R read operation on each first resistive element of the addressed elementary cells for each bit of the codeword, in order to determine a first read value;
   performing a second 1T1R read operation on each second resistive element of the addressed elementary cells for each bit of the codeword, in order to determine a second read value; and
   comparing the first value read in 1T1R mode with the second value read in 1T1R mode in order to identify bits liable to be incorrect as being bits for which the first read value and the second read value are identical.

4. The method according to claim 1, comprising, prior to the determination step, a step of storing the value of each bit of the codeword read in 2T2R mode in a register coupled to the resistive memory.

5. The method according to claim 1, wherein the step of correcting the codeword obtained following inversion comprises steps of:
   storing the value of each bit of said codeword obtained following inversion in a register coupled to the resistive memory;
   correcting said stored codeword using the error correction code; and
   storing the corrected codeword in the output register of the decoder of the error correction code.

6. The method according to claim 1, wherein the comparison step comprises steps of:
   storing the value of each bit read in 1T1R mode in a register coupled to the resistive memory; and
   comparing the value of each stored bit with the value of each bit of the codeword read in 2T2R mode.

7. The method according to claim 1, wherein the step of performing at least one 1T1R-mode read operation consists in comparing the read value with a reference value $R_{ERASURE}$, which may be identical to the reference value used to program the elementary cells of the resistive memory.

8. A device for correcting errors in a codeword stored in a 2T2R resistive memory, a codeword consisting of data bits and check bits, the 2T2R resistive memory comprising a matrix of elementary 2T2R resistive memory cells wherein each elementary cell comprises two transistors and two resistive elements for storing the non-inverted value and the inverted value of a bit, and for reading the stored bits in differential mode, the differential-mode read operation or 2T2R read operation consisting in comparing, with one another, the values of the first and second resistive element of the elementary cell used to store each bit of a word at an indicated address in order to determine the read value, the device comprising means for implementing the steps of the method according to claim 1.

9. The device according to claim 8, wherein the error correction code is a SEC-DED or DEC-TED circuit.

10. The device according to claim 8, wherein the resistive memory is chosen from the group of conductive-bridging random access memories CBRAM, oxide-based random access memories OxRAM, or phase change memories PCM.

11. An FPGA or ASIC electronic system comprising a device according to claim 8.

12. A computer program comprising code instructions for executing the steps of the method according to claim 1 when said program is executed by a processor.

\* \* \* \* \*